United States Patent
Kuribayashi et al.

(10) Patent No.: US 12,432,819 B2
(45) Date of Patent: Sep. 30, 2025

(54) SUBSTRATE FIXING DEVICE

(71) Applicant: SHINKO ELECTRIC INDUSTRIES CO., LTD., Nagano (JP)

(72) Inventors: Akihiro Kuribayashi, Nagano (JP); Riku Nishikawa, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 560 days.

(21) Appl. No.: 17/160,918

(22) Filed: Jan. 28, 2021

(65) Prior Publication Data
US 2021/0243845 A1 Aug. 5, 2021

(30) Foreign Application Priority Data
Jan. 31, 2020 (JP) .................................. 2020-014638

(51) Int. Cl.
| | | |
|---|---|---|
| H05B 3/06 | (2006.01) | |
| H01L 21/683 | (2006.01) | |
| H05B 3/00 | (2006.01) | |

(52) U.S. Cl.
CPC ........... *H05B 3/06* (2013.01); *H01L 21/6833* (2013.01); *H05B 3/0047* (2013.01); *H05B 2203/032* (2013.01)

(58) Field of Classification Search
CPC ............... H01L 21/683; H01L 21/6831; H01L 21/6833; H05B 2203/032; H05B 3/00; H05B 3/0038; H05B 3/0047; H05B 3/06; H05B 3/08
See application file for complete search history.

(56) References Cited

U.S. PATENT DOCUMENTS

| | | | |
|---|---|---|---|
| 2014/0263177 A1* | 9/2014 | Povolny ............ | H01J 37/32935 427/535 |
| 2015/0070814 A1 | 3/2015 | Parkhe et al. | |
| 2016/0007412 A1* | 1/2016 | Busche .................... | H05B 3/14 392/408 |
| 2016/0379853 A1 | 12/2016 | Schaller et al. | |
| 2018/0061684 A1* | 3/2018 | Parkhe .............. | H01L 21/67011 |

FOREIGN PATENT DOCUMENTS

| | | | |
|---|---|---|---|
| JP | 2007048938 A | * | 2/2007 |
| JP | 2018-525813 | | 9/2018 |
| KR | 10-2014-0113610 A | | 9/2014 |

OTHER PUBLICATIONS

Japanese Office Action Corresponding to Japanese Application No. 2020-014638 dated Aug. 29, 2023, with English translation, 6 pages.
Korean Office Action dated Oct. 21, 2024 issued in corresponding Korean application No. 10-2021-0012211; English translation included (11 pages).

* cited by examiner

*Primary Examiner* — Edward F Landrum
*Assistant Examiner* — Theodore J Evangelista
(74) *Attorney, Agent, or Firm* — Rankin, Hill & Clark LLP (57) ABSTRACT

A substrate fixing device includes: an electrostatic chuck that is configured to adsorb and retain an object thereon, and including a base body on which the object is mounted, and an electrostatic electrode that is provided in the base body; and a base plate on which the electrostatic chuck is mounted, and having a plurality of through holes each exposing a first face of the base body facing the base plate. Laser light is emitted from each of the through holes toward the base body.

8 Claims, 7 Drawing Sheets

SUBSTRATE FIXING DEVICE

This application claims priority from Japanese Patent Applications No. 2020-014638, filed on Jan. 31, 2020, the entire contents of which are herein incorporated by reference.

BACKGROUND

Technical Field

The present disclosure relates to a substrate fixing device.

Background Art

In the background art, a film forming apparatus or a plasma etching apparatus used in manufacturing a semiconductor device has a stage for accurately retaining a wafer thereon in a vacuum processing chamber. For example, a substrate fixing device that adsorbs and retains a wafer by an electrostatic chuck mounted on a base plate has been proposed as such a stage.

As an example of the substrate fixing device, there is a substrate fixing device having a structure in which heating elements for adjusting temperature of a wafer are provided. As to this substrate fixing device, for example, a proposal has been made for a method in which resistors are built as the heating elements in an electrostatic chuck and electric power is applied to the resistors to make the resistors generate heat, or for a method in which light emitting diodes used as the heating elements are arranged as a regular array with a fixed number of rows and a fixed number of columns or arrayed in connection with diameters of concentric circles so that the outer one of the concentric circles has a larger number of light emitting diodes than the inner one of the concentric circles (e.g. see JP-A-2018-525813).

In order to control temperatures of a plurality of regions independently in the substrate fixing device, a large number of electric wires or the like for the control need to be led out to the outside of the electrostatic chuck. Further, the electric wires or the like led out to the outside of the electrostatic chuck need to be led out to the outside via through holes formed in a base plate. Therefore, as the number of the electric wires or the like increases, the number of the through holes also increases. That is, due to the increase in the number of the electric wires or the like, an area occupied by the through holes in the base plate increases, and the degree of freedom for designing the base plate decreases.

SUMMARY

The present disclosure provides a substrate fixing device that can suppress a decrease in the degree of freedom for designing a base plate even in a case where temperatures of a plurality of regions of an electrostatic chuck are controlled independently.

A certain embodiment provides a substrate fixing device. The substrate fixing device includes:
- an electrostatic chuck that is configured to adsorb and retain an object thereon, and comprising a base body on which the object is mounted, and an electrostatic electrode that is provided in the base body; and
- a base plate on which the electrostatic chuck is mounted, and having a plurality of through holes each exposing a first face of the base body facing the base plate.

Laser light is emitted from each of the through holes toward the base body.

DESCRIPTION OF EMBODIMENT

An embodiment of the disclosure will be described below with reference to the drawings. In each of the drawings, like constituent portions will be designated by like reference signs correspondingly and respectively, and duplicate description about these constituent portions may be omitted.

First Embodiment

Figure 1:
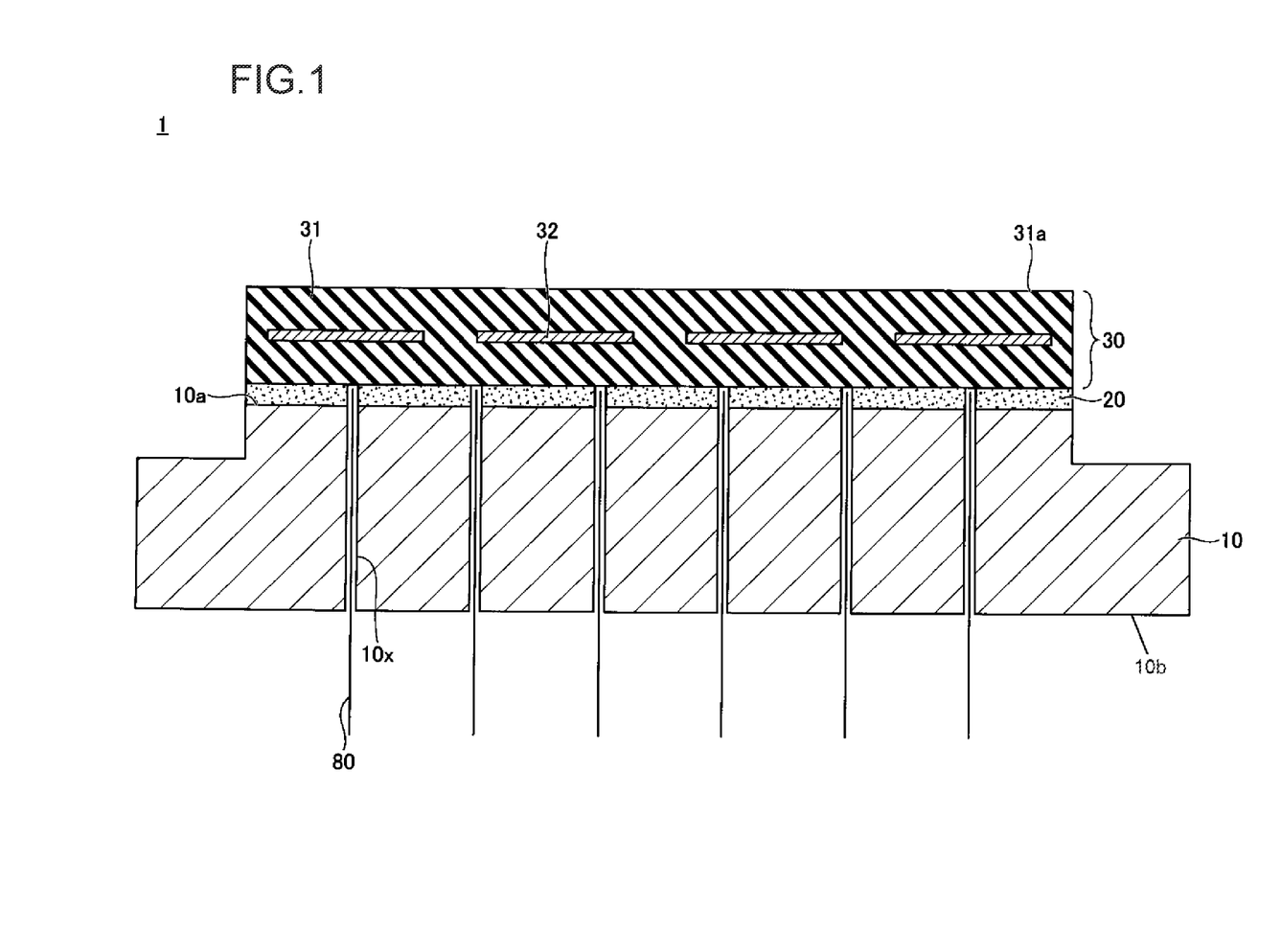
FIG. 1 is a schematic cross-sectional view illustrating a substrate fixing device according to a first embodiment in a simplified manner.

FIG. 1 is a schematic cross-sectional view illustrating a substrate fixing device according to a first embodiment in a simplified manner. With reference to FIG. 1, the substrate fixing device 1 has a base plate 10, an adhesive layer 20, an electrostatic chuck 30 and optical fibers 80 as main constituent elements. The substrate fixing device 1 is a device that adsorbs and retains a substrate (such as a wafer) which is an adsorption object, by the electrostatic chuck 30 mounted on one face of the base plate 10.

The base plate 10 is a member for mounting the electrostatic chuck 30 thereon. The base plate 10 is, for example, about 20 to 40 mm thick. The base plate 10 which is, for example, formed out of aluminum can be used as an electrode or the like for controlling plasma. By predetermined high frequency electric power supplied to the base plate 10, energy for making ions etc. in a plasma state collide against the substrate adsorbed on the electrostatic chuck 30 can be controlled so as to etch the substrate effectively.

A plurality of through holes 10x exposing a face of a base body 31 on the side of the base plate 10 are formed in the base plate 10 and the adhesive layer 20. The optical fibers 80 through which laser lights are propagated are disposed in the through holes 10x respectively. The optical fibers 80 may be fixed to the through holes 10x by an adhesive agent or the like or may be fixed to the base plate 10 through a socket provided on a lower face of the base plate 10.

A gas supply path into which inert gas for cooling the substrate adsorbed on the electrostatic chuck 30 is introduced may be provided in the base plate 10. When, for example, the inert gas such as He or Ar is introduced into the gas supply path from the outside of the substrate fixing device 1 and supplied to a back face of the substrate adsorbed on the electrostatic chuck 30, the substrate can be cooled.

A refrigerant flow path may be provided in the base plate 10. The refrigerant flow path is, for example, a hole that is formed annularly inside the base plate 10. For example, a refrigerant such as cooling water or Galden is introduced into the refrigerant flow path from the outside of the substrate fixing device 1. When the refrigerant is circulated in the refrigerant flow path to cool the base plate 10, the substrate adsorbed on the electrostatic chuck 30 can be cooled.

The electrostatic chuck 30 is a portion that adsorbs and retains the substrate which is the adsorption object. The planar shape of the electrostatic chuck 30 is, for example, a circle. The diameter of the substrate which is the object adsorbed by the electrostatic chuck 30 is, for example, 8, 12, or 18 inches.

Assume here that a plan view denotes a view of an object from a normal direction of an upper face 10a of the base plate 10, and a planar shape denotes the shape of the object viewed from the normal direction of the upper face 10a of the base plate 10.

The electrostatic chuck 30 is provided on the upper face 10a of the base plate 10 through the adhesive layer 20. The adhesive layer 20 is, for example, a silicone-based adhesive agent. The adhesive layer 20 is, for example, about 0.1 mm to 2.0 mm thick. The adhesive layer 20 fixes the base plate 10 and the electrostatic chuck 30 to each other, and has an effect of reducing stress caused by a difference in coefficient of thermal expansion between the electrostatic chuck 30 made of ceramics and the base plate 10 made of aluminum.

The electrostatic chuck 30 has a base body 31 and an electrostatic electrode 32 as main constituent elements. An upper face of the base body 31 is a mounting face 31a on which the adsorption object is mounted. The electrostatic chuck 30 is, for example, a Johnsen-Rahbek type electrostatic chuck. However, the electrostatic chuck 30 may be a Coulomb force type electrostatic chuck alternatively.

The base body 31 is a dielectric. For example, ceramics such as aluminum oxide ($Al_2O_3$) or aluminum nitride (AlN) is used as the base body 31. The base body 31 may contain, as auxiliary agents, oxides of two or more elements that are, for example, selected from the group consisting of silicon (Si), magnesium (Mg), calcium (Ca), aluminum (Al), and yttrium (Y). The base body 31 is, for example, about 5 mm to 10 mm thick. A relative dielectric constant of the base body 31 (at 1 kHz) is, for example, about 9 to 10.

The electrostatic electrode 32 which is, for example, a thin film electrode is built in the base body 31. When the electrostatic electrode 32 is connected to a power supply provided outside the substrate fixing device 1 and a predetermined voltage is applied to the electrostatic electrode 32 from the power supply, adsorptive force is generated between the electrostatic electrode 32 and the wafer due to static electricity. Thus, the wafer can be adsorbed and retained on the mounting face 31a of the base body 31 of the electrostatic chuck 30. As the voltage applied to the electrostatic electrode 32 is higher, the adsorptive retention force is stronger. The electrostatic electrode 32 may have a unipolar shape or a bipolar shape. For example, tungsten, molybdenum, or the like is used as the material of the electrostatic electrode 32.

Figure 2:
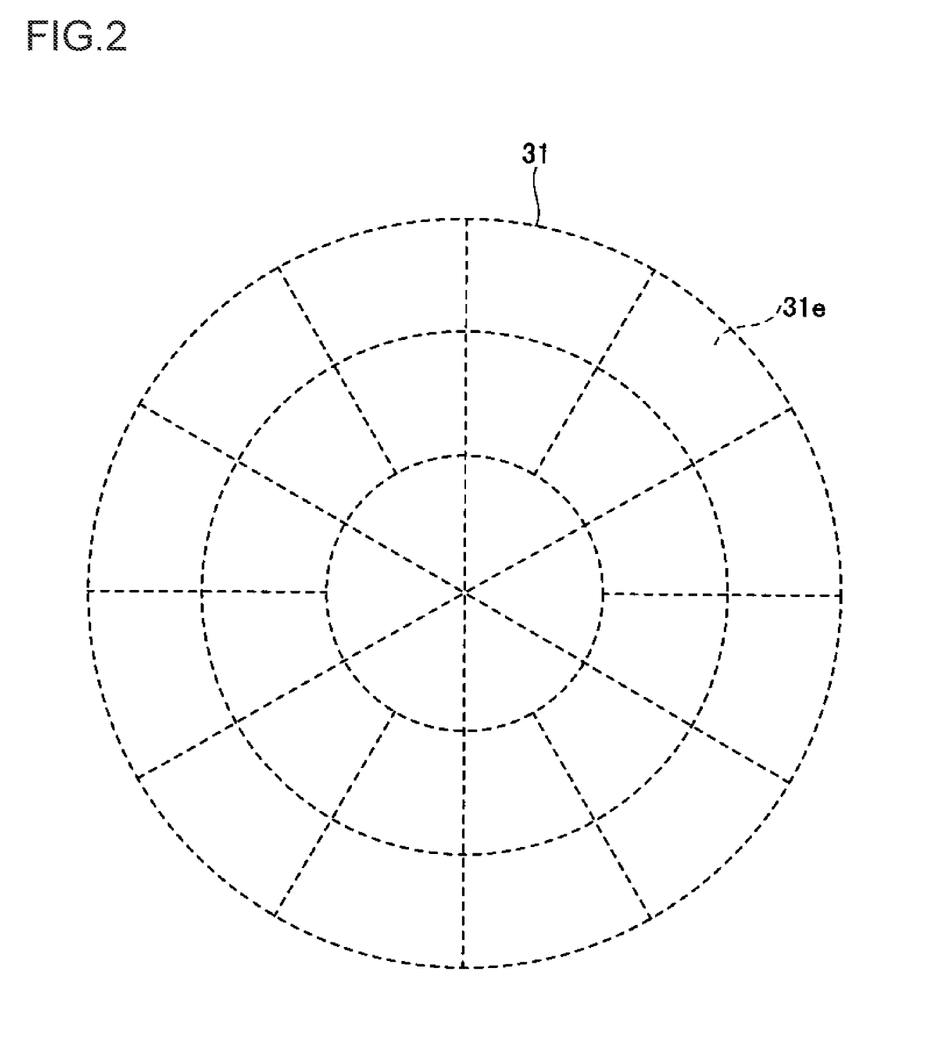
FIG. 2 is a plan view illustrating temperature-controllable regions defined in a base body.

FIG. 2 is a plan view illustrating temperature-controllable regions defined in the base body. As shown in FIG. 2, the plurality of temperature-controllable regions 31e whose temperatures can be independently controlled are defined in the base body 31 in the plan view. In the example of FIG. 2, thirty temperature-controllable regions 31e are defined. However, the number of the temperature-controllable regions 31e may be set in a range of about 100 to 200 alternatively. Further, each of the temperature-controllable regions 31e can have any planar shape. The temperature-controllable region 31 does not necessarily have to be substantially divided into a concentric shape but may be, for example, substantially divided into a grid shape.

Figure 3:
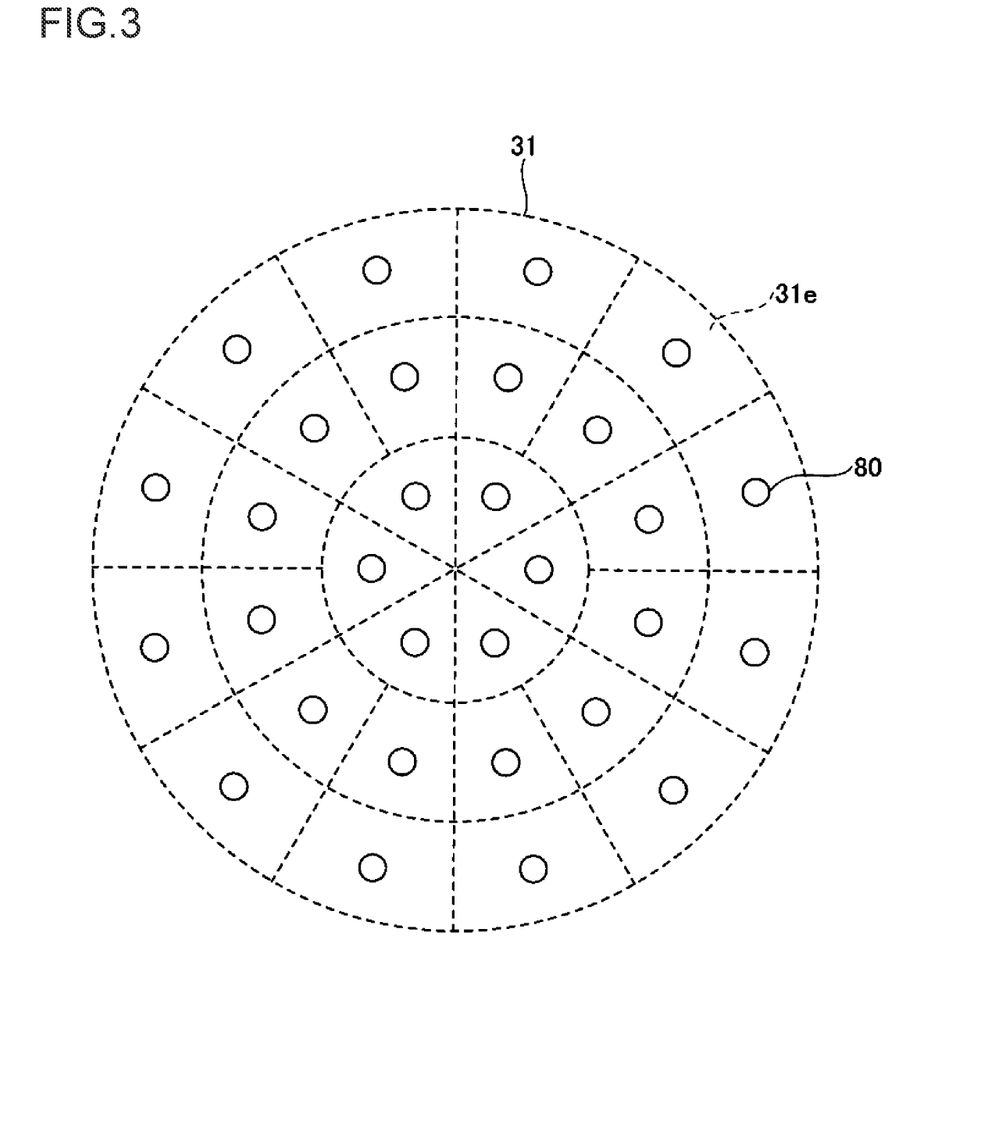
FIG. 3 is a plan view schematically illustrating arrangement of optical fibers for heating the temperature-controllable regions respectively.

FIG. 3 is a plan view schematically showing arrangement of the optical fibers for heating the temperature-controllable regions respectively. Laser lights are propagated through the optical fibers 80. When the laser lights propagated through the optical fibers 80 are radiated on the base body 31, the base body 31 is heated.

As shown in FIG. 3, at least one optical fiber 80 is disposed at a place corresponding to each of the temperature-controllable regions 31e in the base plate 10. By changing intensity of the laser light propagated through the optical fiber 80 disposed in each of the temperature-controllable regions 31e, an amount of heat generated in the temperature-controllable region 31e can be changed independently. In this manner, the temperature-controllable regions 31e whose temperatures can be independently controlled are defined in the base plate 31 and one optical fiber 80 is disposed in each of the temperature-controllable regions 31e. With this arrangement, the mounting face 31a of the base body 31 can be heated uniformly.

Figure 4:
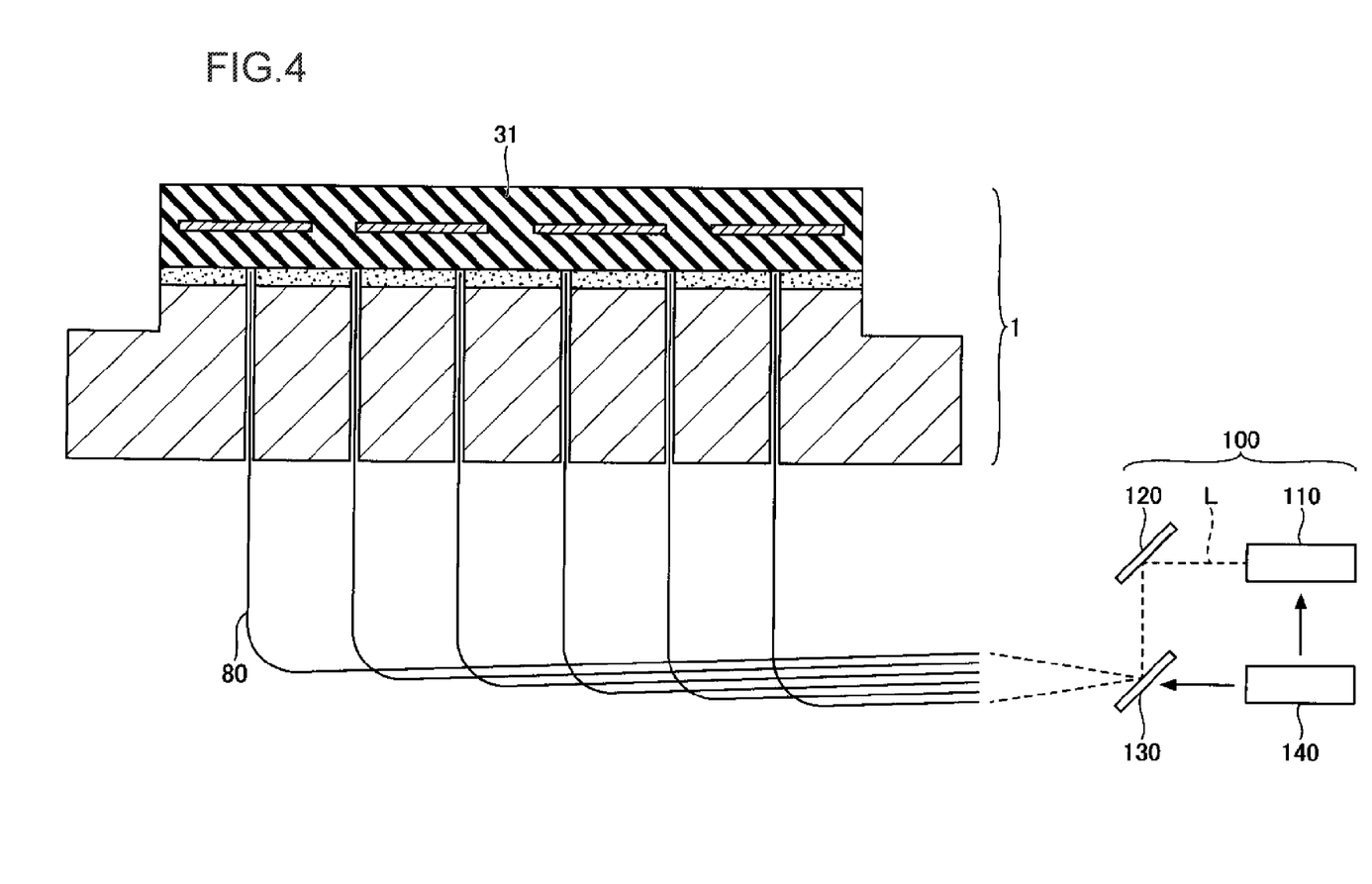
FIG. 4 is a schematic view illustrating a laser radiation device disposed outside the substrate fixing device.

FIG. 4 is a schematic view illustrating a laser radiation device disposed outside the substrate fixing device. As shown in FIG. 4, the laser radiation device 100 has a laser light source 110, a mirror 120, an optical scanning unit 130, and a control circuit 140. As the laser light source 110, for example, a YAG laser, a carbon dioxide gas laser, or the like can be used. In a case where the base body 31 contains alumina as a main component, a wavelength band of laser light emitted from the laser light source 110 is preferably an infrared region that is easily absorbed by the alumina. An output of the laser light emitted from the laser light source 110 is preferably about several kW to several tens of kW.

As the optical scanning unit 130, for example, a galvano scanner in which two mirrors are controlled by a motor, an optical scanning unit formed by MEMS technology, a digital mirror device, or the like can be used. The laser light L emitted from the laser light source 110 based on a command of the control circuit 140 has its optical path changed by the mirror 120 and is then incident on the optical scanning unit 130. The laser light L incident on the optical scanning unit 130 is scanned by the optical scanning unit 130 based on a command of the control circuit 140 so as to be incident on a predetermined one of the optical fibers 80 and reach a lower face of the base body 31.

The optical scanning device 130 repeats the laser scanning based on the command of the control circuit 140 and sequentially makes the laser light incident on one of the optical fibers 80 after another. In this manner, the base body 31 can be heated. Heating temperature can be controlled by a time during which the laser light is incident on one and the same optical fiber 80. For example, temperature of the mounting face 31a of the base body 31 can be heated to about 200° C. by the laser light propagated through the optical fiber 80.

The use of the laser radiation device 100 in FIG. 4 may be replaced with a configuration in which laser light sources equal in number to the optical fibers 80 are prepared so that laser light from each of the laser light sources can be made incident on a corresponding one of the optical fibers 80. Alternatively, a fiber laser in which a low reflection mirror is set at an emission side end of the optical fiber 80 and a high reflection mirror is set at an incidence side end of the optical fiber 80, and excitation light is made to enter from the incidence side end of the optical fiber 80 may be used.

An effect obtained by the electrostatic chuck 30 constituting the substrate fixing device 1 will be described here while a comparative example is given.

Figure 5:
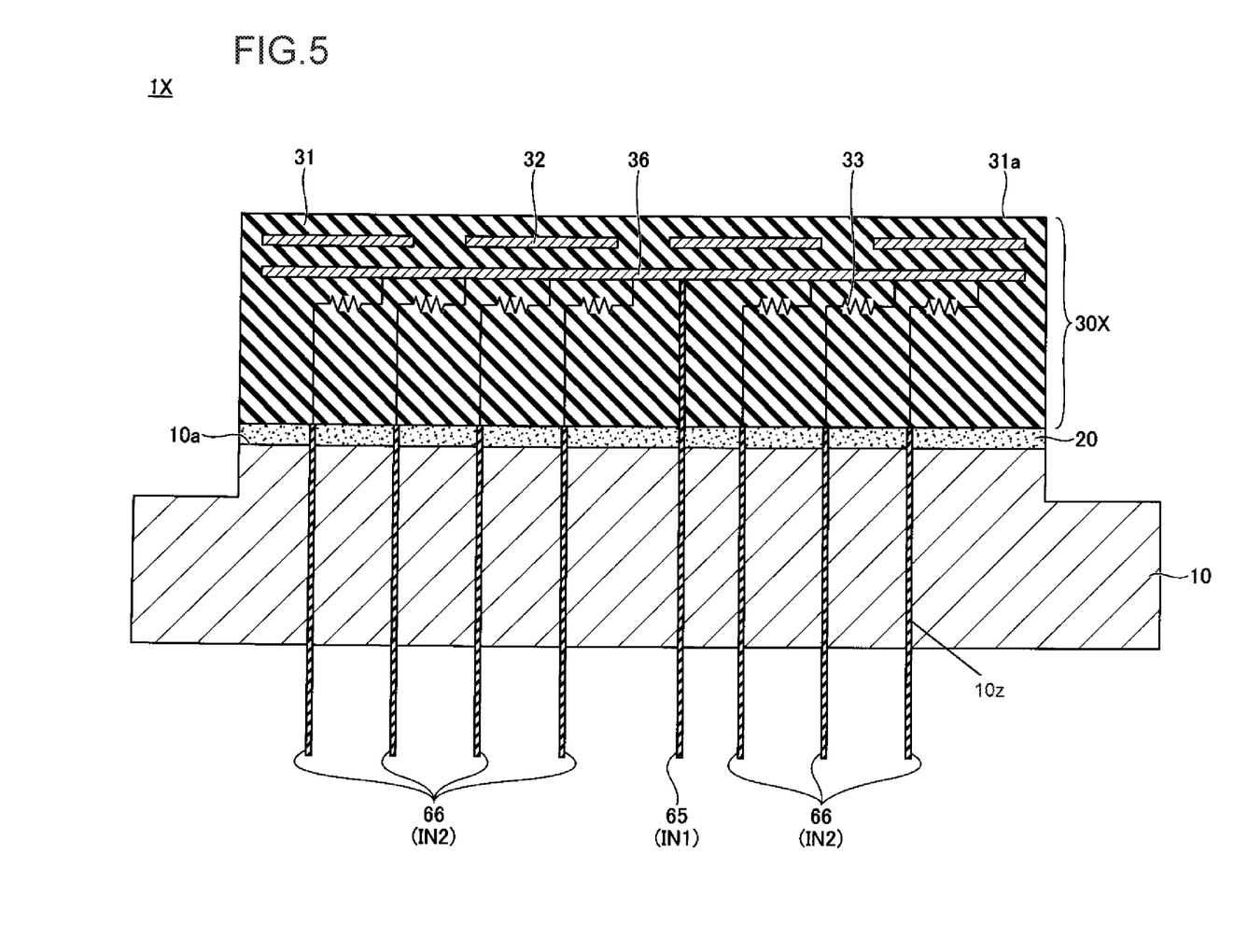
FIG. 5 is a schematic cross-sectional view illustrating a substrate fixing device according to a comparative example in a simplified manner.

FIG. 5 is a schematic cross-sectional view illustrating a substrate fixing device according to the comparative example in a simplified manner. With reference to FIG. 5, the substrate fixing device 1X differs from the substrate fixing device 1 (see FIG. 1 etc.) in that the electrostatic chuck 30 is replaced with an electrostatic chuck 30X.

The electrostatic chuck 30X has a base body 31, an electrostatic electrode 32, heating elements 33, and wiring 36 as main constituent elements. A plurality of temperature-controllable regions 31e whose temperatures can be controlled independently are defined in the base body 31 in a plan view in a manner similar to or the same as that in FIG. 2. Further, one heating element 33 is disposed in each of the temperature-controllable regions 31e in a manner similar to or the same as the case of the optical fibers 80 in FIG. 3. The heating elements 33 disposed in the temperature-controllable regions 31e respectively are insulated from one another. By changing a value of a current flowing into each of the heating elements 33, an amount of heat generated by the heating element 33 can be changed independently.

One ends of the heating elements 33 are connected to an input/output IN1 electric wire 65 through the wiring 36. The electric wire 65 is led out to the outside of the substrate fixing device 1X The other ends of the heating elements 33 are connected to input/output IN2 electric wires 66 respectively. The electric wires 66 are led out to the outside of the substrate fixing device 1X. The total of the electric wire 65 and the electric wires 66 is the number of the heating elements 33+1. When, for example, there are one hundred heating elements 33, the total of the electric wire 65 and the electric wires 66 is one hundred and one.

For example, one of the electric wire 65 and each electric wire 66 is connected to the GND and the other of the electric wire 65 and the electric wire 66 is connected to a power supply. An amount of heat generated by each heating element 33 can be changed by a value of a voltage applied between the opposite ends of the heating element 33 through the electric wire 65 and the electric wire 66. Alternatively, a constant voltage (pulsed voltage) may be supplied between the opposite ends of each heating element 33 via the electric wire 65 and the electric wire 66. In this case, the amount of heat generated by the heating element 33 can be changed by changing a time during which the voltage is supplied to the heating element 33.

A relatively large current required for heat generation of the heating element 33 flows into the electric wire 65 and the electric wire 66. Since strong insulation is required between the base plate 10 to which high frequency electric power for controlling plasma is applied and the electric wires 65 and 66, the diameter of each of through holes 10z of the base plate 10 in which the electric wire 65, 66 is disposed is, for example, $\phi$ 5 mm. Further, the diameter of the electric wire 65, 66 is, for example, $\phi$ 4 mm. Therefore, as the total number of the electric wire 65 and the electric wires 66 increases, an area occupied by the through holes in the base plate 10 becomes so large that it cannot be ignored.

For example, assume that the number of the temperature-controllable regions 31e is 100 in the case of the structure of the substrate fixing device 1X according to the comparative example shown in FIG. 5. In this case, it is necessary to use one hundred or more electric wires for electrical connection between the substrate fixing device and the outside. Therefore, it is necessary to lead out the one hundred or more electric wires to the outside through the through holes 10z formed in the base plate 10. In this case, the area occupied by the through holes 10z in the base plate 10 becomes so large that it cannot be ignored, as described above, and the degree of freedom for designing the base plate 10 significantly decreases.

Also in the case of the substrate fixing device 1, the optical fibers 80 equal in number to the temperature control regions 31e are required. However, the diameter of each of the through holes 10z in which the electric wire 65, 66 is disposed in the substrate fixing device 1X is about $\phi$ 5 mm, as described above, whereas the diameter of each of the through holes 10x in which the optical fiber 80 is disposed in the substrate fixing device 1 is about $\phi$ 0.5 mm to be about one tenth of the diameter of the through hole where the electric wire 65, 66 is disposed.

Therefore, even in a case where a large number of the through holes 10x in which the optical fibers 80 are disposed are provided in the base plate 10, the area occupied by the through holes 10x in the base plate 10 is substantially reduced as compared with a case where the same number of the through holes in which the electric wires 65 and 66 are disposed are provided in the base plate 10. That is, the substrate fixing device 1 can suppress the decrease in the degree of freedom for designing the base plate 10 even in the case where the large number of the through holes 10x are provided in the base plate 10.

Further, portions related to heat generation in the substrate fixing device 1 have no electrical connection between the substrate fixing device 1 and the outside. Accordingly, cost can be reduced due to a reduction in the number of components required for the connection to the outside. Further, solders for the electrical connection between the substrate fixing device 1 and the outside are dispensed with. Accordingly, assembly difficulty can be greatly decreased due to a significant reduction in the number of soldering points, etc., so that an improvement in yield and reliability of the substrate fixing device 1 can be expected. Since the electrostatic chuck 30 is a consumable component, a cost reduction effect obtained by the improvement of the yield is large.

Further, the optical fibers 80 do not require electrical insulation from the base plate 10. Accordingly, any insulating material or the like in each of the through holes 10x is not required, which also leads to cost reduction.

Modification 1 of First Embodiment

An example in which the position of the front end of each of optical fibers is retracted downward is shown in a modification 1 of the first embodiment. In the modification 1 of the first embodiment, description about constituent elements having the same reference signs as those in the aforementioned embodiment may be omitted.

Figure 6:
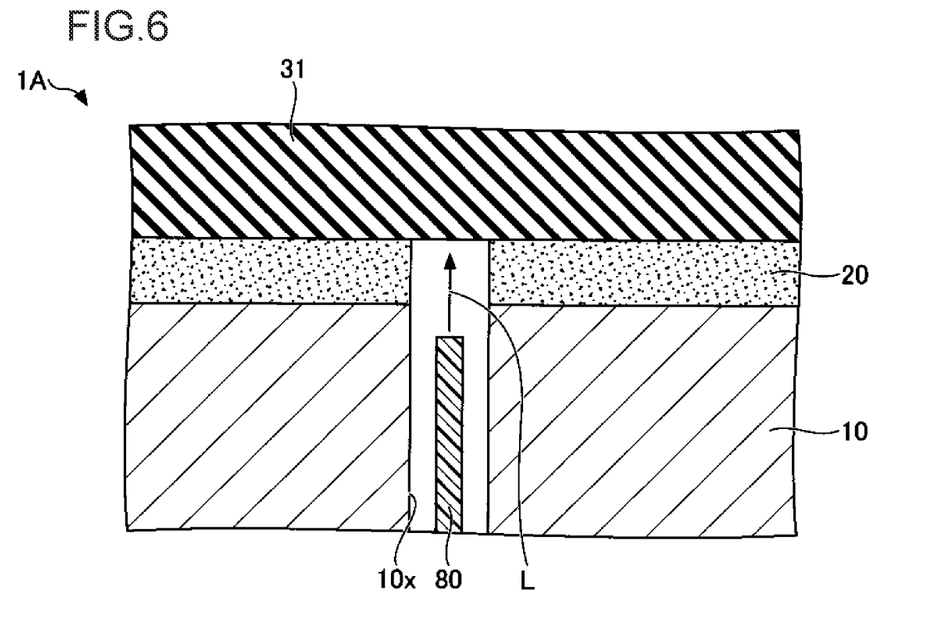
FIG. 6 is a partially enlarged cross-sectional view in which a peripheral portion of an optical fiber in a substrate fixing device according to a modification 1 of the first embodiment is enlarged.

FIG. 6 is a partially enlarged cross-sectional view in which a peripheral portion of one of the optical fibers in a substrate fixing device 1A according to the modification 1 of the first embodiment is enlarged.

In FIG. 1, the front ends of the optical fibers 80 are respectively positioned in the through holes 10x formed in the adhesive layer 20. On the other hand, in the substrate fixing device 1A in FIG. 6, the front ends of the optical fibers 80 are respectively positioned in through holes 10x formed in a base plate 10 but do not go into through holes 10x formed in an adhesive layer 20.

Due to a difference in coefficient of thermal expansion between the base plate 10 and a base body 31, the base body 31 is generally displaced in a horizontal direction with respect to the base plate 10 depending on temperature conditions. On this occasion, the adhesive layer 20 is also displaced. Accordingly, when the front ends of the optical fibers 80 go into the through holes 10x formed in the adhesive layer 20, the front ends of the optical fibers 80 may bear damage such as deterioration. As shown in FIG. 6, the front ends of the optical fibers 80 are positioned in the through holes 10x formed in the base plate 10 but do not go into the through holes 10x formed in the adhesive layer 20. Accordingly, the front ends of the optical fibers 80 can avoid bearing damage such as deterioration. An amount of the displacement of the base body 31 with respect to the base plate 10 is larger toward an outer circumferential side of the base body 31. Therefore, a particularly conspicuous effect is obtained in those through holes 10x disposed on an outer circumferential side of the base plate 10.

Modification 2 of First Embodiment

An example in which recesses are provided at places of a base body 31 in which laser lights are radiated from optical fibers 80 is shown in a modification 2 of the first embodiment. In the modification 2 of the first embodiment, description about constituent elements having the same reference signs as those in the aforementioned embodiment may be omitted.

Figure 7:
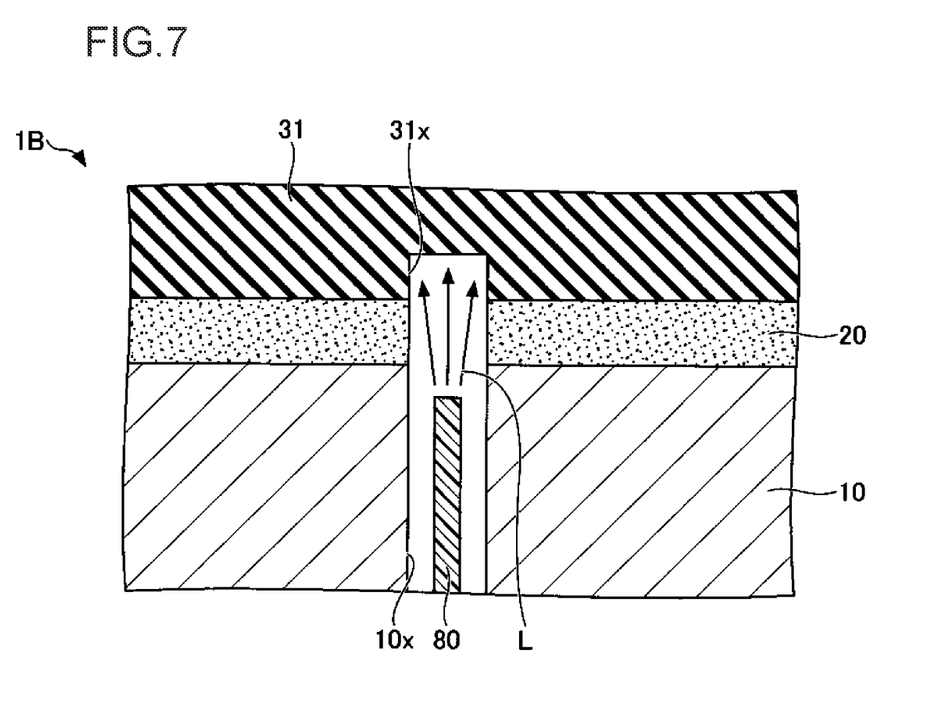
FIG. 7 is a partially enlarged cross-sectional view in which a peripheral portion of an optical fiber in a substrate fixing device according to a modification 2 of the first embodiment is enlarged.

FIG. 7 is a partially enlarged cross-sectional view in which a peripheral portion of one of the optical fibers 80 in a substrate fixing device 1B according to the modification 2 of the first embodiment is enlarged. As shown in FIG. 7, the recesses 31x onto which the laser lights propagated through the optical fibers 80 are radiated are formed in a face of the base body 31 on the side of a base plate 10 in the substrate fixing device 1B. The recesses 31x communicate with through holes 10x respectively. However, the recesses 31x may be different in diameter from the through holes 10x.

In FIG. 7, the laser light L emitted from each of the optical fibers 80 is radiated onto a bottom face and a side face of a corresponding one of the recesses 31x. For example, since the recesses 31x each shaped like a circle are formed, an area of the base body 31 onto which the laser lights L are radiated increases as compared with the case of FIG. 1 or FIG. 6. Consequently, the base body 31 can be easily heated.

Modification 3 of First Embodiment

A substrate fixing device 1C is shown by way of example in a modification 3 of the first embodiment. The substrate fixing device 1C is provided with an electrostatic chuck in which heating elements generating heat due to a voltage applied thereto from the outside are built in a base body 31. In the modification 3 of the first embodiment, description about constituent elements having the same reference signs as those in the aforementioned embodiment may be omitted.

Figure 8:
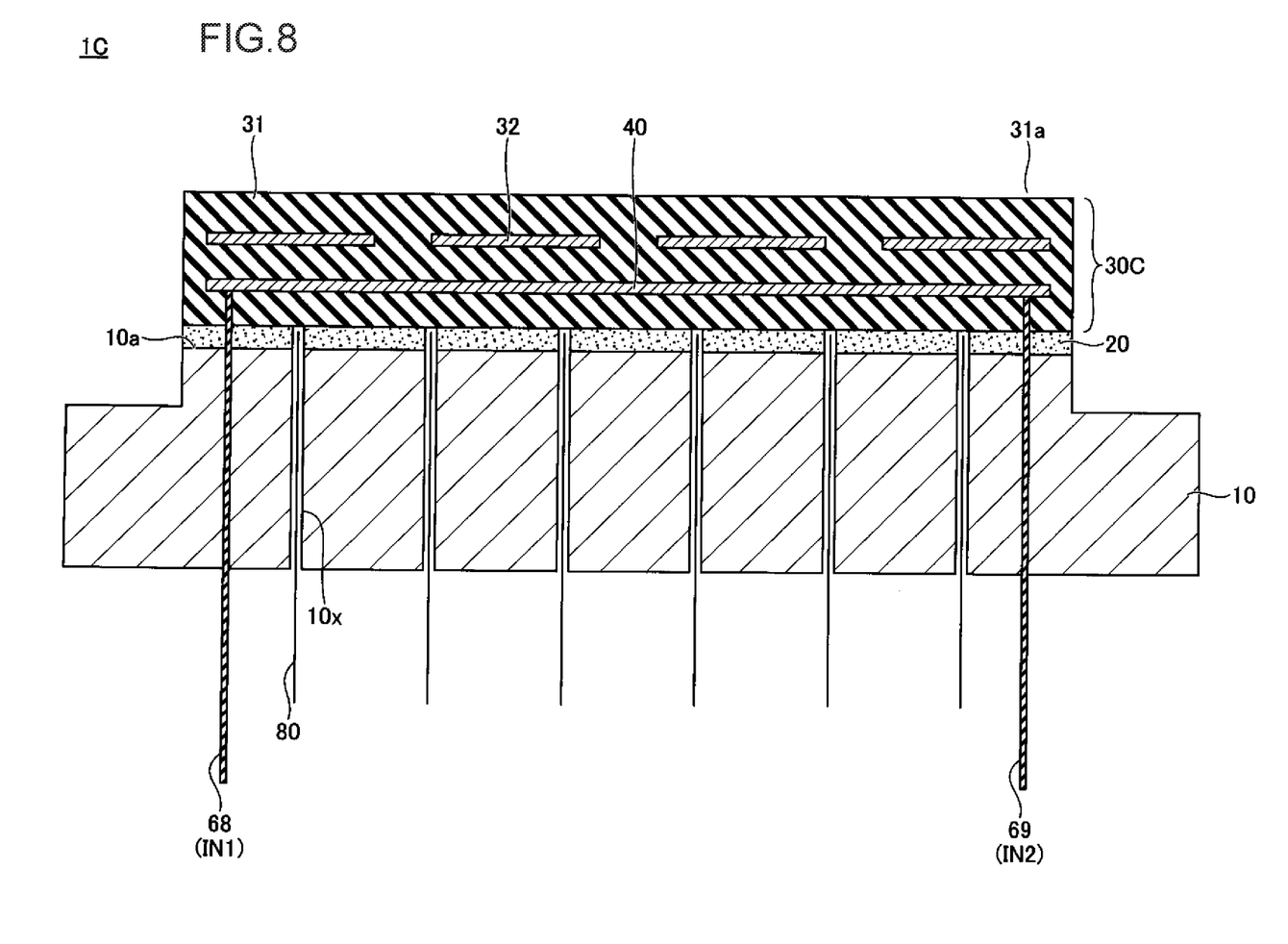
FIG. 8 is a schematic cross-sectional view illustrating a substrate fixing device according to a modification 3 of the first embodiment in a simplified manner.

FIG. 8 is a schematic cross-sectional view illustrating the substrate fixing device 1C according to the modification 3 of the first embodiment in a simplified manner. With reference to FIG. 8, the substrate fixing device 1C differs from the substrate fixing device 1 (see FIG. 1 etc.) in that the electrostatic chuck 30 is replaced with an electrostatic chuck 30C. Further, the electrostatic chuck 30C differs from the electrostatic chuck 30 (see FIG. 1 etc.) in that a heating element 40, an input/output IN1 electric wire 68, and an input/output IN2 electric wire 69 are added.

The heating element 40 built in the electrostatic chuck 30C can be, for example, disposed on a base plate 10 side of an electrostatic electrode 32 in a thickness direction. The heating element 40 which is, for example, a single resistor formed into a spiral pattern or the like is disposed to heat an entire mounting face 31a of the base body 31 over a plurality of temperature-controllable regions 31e. As the material of the heating element 40, for example, tungsten (W), copper (Cu), nickel (Ni), constantan (Cu/Ni/Mn/Fe alloy), or the like can be used. The heating element 40 is, for example, about 20 to 100 μm thick.

One end of the heating element 40 is connected to the input/output IN1 electric wire 68. The electric wire 68 is led out to the outside of the substrate fixing device 1C. The other end of the heating element 40 is connected to the input/output IN2 electric wire 69. The electric wire 69 is led out to the outside of the substrate fixing device 1C. There are one electric wire 68 and one electric wire 69.

For example, one of the electric wire 68 and the electric wire 69 is connected to the ground GND, and the other of the electric wire 68 and the electric wire 69 is connected to a power supply. An amount of heat generated by the heating element 40 can be changed by a value of a voltage applied between the opposite ends of the heating element 40 through the electric wire 68 and the electric wire 69. Alternatively, a constant voltage (pulsed voltage) may be supplied between the opposite ends of the heating element 40 through the electric wire 68 and the electric wire 69. In this case, the amount of heat generated by the heating element 40 can be changed by changing a time during which the voltage is applied to the heating element 40.

Thus, the heating element 40 may be built in the base body 31. For example, while a current is made to flow into the heating element 40 to heat the mounting face 31a of the base body 31, only portions of the mounting face 31a which were not heated sufficiently are heated by laser lights emitted from the optical fibers 80. With this arrangement, the entire mounting face 31a of the base body 31 can be heated uniformly.

In the above description, the heating element 40 is set as a single resistor. However, the heating element 40 may be set as a plurality of independent resistors so as to be able to control temperatures of a plurality of regions independently.

Besides a semiconductor wafer (such as a silicon wafer), for example, a glass substrate or the like used in a process of manufacturing a liquid crystal panel or the like can be exemplified as the object adsorbed by the substrate fixing device according to the present disclosure.

Moreover, in the present embodiment, laser light emitted from the laser light source 110 is guided to each of the optical fibers 80 and then radiated from the front end of the optical fiber 80 toward the base body 31. However, the present embodiment is not limited thereto. For example, a plurality of laser light sources may be disposed in the vicinity of the lower face 10b (see FIG. 1) of the base plate 10. In this case, each of the laser light sources may be disposed to face a corresponding one of the through holes 10x formed in the base plate 10. Laser light emitted from each of the laser light sources may be radiated toward the base body 31 after being transmitted through a corresponding one of the through holes 10x. Also in this case, the base body 31 can be likewise heated by the laser light emitted from each of the laser light sources.

Although the preferred embodiments etc. have been described in detail, the invention is not limited to the above-described embodiments etc. and various modifications and replacements can be made in the above-described embodiments etc. without departing from the scope of the claims.

What is claimed is:

1. A substrate fixing device comprising:
    an electrostatic chuck that is configured to adsorb and retain an object thereon, and comprising a base body formed of a dielectric material and on which the object is mounted, and an electrostatic electrode that is provided in the base body;
    a base plate on which the electrostatic chuck is mounted with a first face of the base plate facing a first face of the base body, the base plate having a plurality of through holes each exposing the first face of the base body,
    wherein
    a plurality of recesses are formed in the first face of the base body, each of the plurality of recesses communicates with a respective one of the plurality of through holes, and each of the plurality of recesses includes a side face and a bottom face formed of the dielectric material, where the bottom face is exposed to and faces the respective one of the plurality of through holes,
    the substrate fixing device further comprises a plurality of optical fibers, each of the plurality of optical fibers is disposed in a respective one of the plurality of through holes so laser light emitted from the plurality of optical fibers is radiated directly onto the dielectric material forming the bottom face and the side face of each of the plurality of recesses, and
    a front end of each of the plurality of optical fibers that faces the base body is disposed within the respective one of the plurality of through holes and does not project past the first face of the base plate toward the base body.

2. The substrate fixing device according to claim 1, wherein:
    the base body is divided into a plurality of regions;
    each of temperatures of the regions is controlled independently; and
    each of the plurality of optical fibers is disposed in a corresponding one of the plurality of regions.

3. The substrate fixing device according to claim 2, wherein:
    a first optical fiber of the plurality of optical fibers is disposed in a first region of the plurality of regions; and
    laser light emitted from the first optical fiber is radiated toward the first region so that the first region is heated.

4. The substrate fixing device according to claim 1, wherein:
    the base body contains alumina as a main component, and a wavelength band of the laser light is an infrared region.

5. The substrate fixing device according to claim 1, further comprising:
    an adhesive layer that is provided between the first face of the base body and the first face of the base plate to fix the electrostatic chuck and the base plate to each other, wherein:
    the plurality of through holes are formed in the base plate and the adhesive layer so as to expose the first face of the base body, including the bottom face and the side face of each of the plurality of recesses; and
    the front end of each of the plurality of optical fibers is disposed within the respective one of the plurality of through holes and does not project past the first face of the base plate toward the base body so that the front ends of the plurality of optical fibers do not enter the plurality of through holes formed in the adhesive layer.

6. The substrate fixing device according to claim 1, wherein
    the electrostatic chuck further comprises a heating element provided in the base body.

7. The substrate fixing device according to claim 1, wherein
    the dielectric material is a ceramic.

8. The substrate fixing device according to claim 7, wherein
    the ceramic is one of aluminum oxide ($Al_2O_3$) or aluminum nitride (AlN).

* * * * *